(12) United States Patent
Kim

(10) Patent No.: US 7,933,135 B2
(45) Date of Patent: Apr. 26, 2011

(54) SEMICONDUCTOR MEMORY APPARATUS INCLUDING A COUPLING CONTROL SECTION

(75) Inventor: Jong Su Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 160 days.

(21) Appl. No.: 12/341,449

(22) Filed: Dec. 22, 2008

(65) Prior Publication Data

US 2010/0091543 A1 Apr. 15, 2010

(30) Foreign Application Priority Data

Oct. 14, 2008 (KR) ........................ 10-2008-0100646

(51) Int. Cl.
*G11C 11/34* (2006.01)
(52) U.S. Cl. .......................................... 365/63; 365/51
(58) Field of Classification Search .................... 365/63, 365/51
See application file for complete search history.

(56) References Cited

U.S. PATENT DOCUMENTS

| 6,215,693 | B1 * | 4/2001 | Chung et al. ................... 365/145 |
| 6,295,223 | B1 * | 9/2001 | Choi et al. ..................... 365/145 |
| 6,768,663 | B2 | 7/2004 | Ogata |
| 7,245,542 | B2 * | 7/2007 | Park et al. ..................... 365/201 |
| 7,310,257 | B2 | 12/2007 | Manning et al. |

FOREIGN PATENT DOCUMENTS

KR 1020070043177 A 4/2007
KR 1020070113813 A 11/2007

* cited by examiner

*Primary Examiner* — Son T Dinh
(74) *Attorney, Agent, or Firm* — Ladas & Parry LLP

(57) ABSTRACT

A semiconductor memory apparatus is disclosed having a dual open bit line structure In the dual open bit line structure, bit lines or bit line bars are each arranged side by side in adjoining cell mats. The semiconductor memory apparatus includes a coupling control section connected between at least one pair of adjoining bit lines or at least one pair of adjoining bit line bars and is driven by a bit line equalize signal. The coupling control section prevents a coupling phenomenon from occurring between pairs of bit lines and bit line bars.

4 Claims, 4 Drawing Sheets

SEMICONDUCTOR MEMORY APPARATUS INCLUDING A COUPLING CONTROL SECTION

CROSS-REFERENCES TO RELATED APPLICATION

The present application claims priority under 35 U.S.C. §119(a) to Korean application number 10-2008-0100646, filed on Oct. 14, 2008, in the Korean Intellectual Property Office, which is incorporated herein by reference in its entirety as set forth in full.

BACKGROUND

1. Technical Field

The present invention relates generally to a semiconductor memory apparatus, and more particularly, to a semiconductor memory apparatus that has an open bit line structure.

2. Related Art

In order to realize highly integrated semiconductor memory apparatuses, semiconductor memory apparatuses have recently been developed having an open bit line structure (6F2).

A folded bit line structure in which bit lines and bit line bars exist in the same cell mat is different from the open bit line structure in which bit lines and bit line bars exist in different cell mats.

FIG. 1 is a view showing the configuration of a conventional semiconductor memory apparatus having an open bit line structure.

Referring to FIG. 1, a semiconductor memory apparatus includes a plurality of cell mats 10-1 and 10-2. The cell mats 10-1 and 10-2 have a plurality of memory cells connected between word lines WL10-WL1$i$ and WL20-WL2$i$ and open bit lines BL0-BLn and /BL0-/BLn. In addition, a sense amplifier block 20 is located between the cell mats 10-1 and 10-2. The bit lines BL0-BLn and /BL0-/BLn, which are connected to the memory cells of the adjoining cell mats 10-1 and 10-2, are commonly connected to their respective sense amplifiers SA of the sense amplifier block 20.

In a recently developed semiconductor memory apparatus having an open bit line structure, the bit lines or bit line bars that are connected to adjoining sense amplifiers, are arranged side by side as shown in FIG. 1. This structure arrangement is called a dual open bit line structure.

In the semiconductor memory apparatus having the dual open bit line structure, when a certain bit line (e.g. BL1) is selected for a sensing operation, a coupling phenomenon occurs between the selected bit line BL1 and an adjacent bit line BL2 connected to the adjoining sense amplifier SA.

Likewise, when a certain bit line bar (e.g. /BL2) is selected, a coupling phenomenon occurs between the selected bit line bar /BL2 and an adjacent bit line bar /BL3 connected to the adjoining sense amplifier SA.

As a result, the semiconductor memory apparatus is likely to malfunction due to the coupling phenomenon and the overall reliability of the semiconductor apparatus may deteriorate.

SUMMARY

A semiconductor memory apparatus which has an open bit line structure and can prevent a coupling phenomenon from occurring between adjoining bit lines is described herein.

Also, a semiconductor memory apparatus which has an open bit line structure and can electrically insulate adjoining bit lines is described herein.

In one embodiment of the present invention, a semiconductor memory apparatus having a dual open bit line structure in which bit lines or bit line bars are each arranged side by side in adjoining cell mats comprises a coupling control section connected between at least one pair of adjoining bit lines or at least one pair of adjoining bit line bars and driven by a bit line equalize signal.

A semiconductor memory apparatus having a dual open bit line structure in which bit lines or bit line bars are each arranged side by side in adjoining cell mats comprises a plurality of cell mats having plural numbers of memory cells which are connected between word lines and bit lines; a sense amplifier block located between the cell mats and having a plurality of sense amplifiers to which bit lines of memory cells included in adjoining cell mats are connected; and a coupling control section connected between at least one pair of adjoining bit lines or at least one pair of adjoining bit line bars and driven by a bit line equalize signal.

BRIEF DESCRIPTION OF THE DRAWINGS

The above objects, features, and advantages will become more apparent after a reading of the following detailed description taken in conjunction with the drawings, in which.

DETAILED DESCRIPTION

Hereafter, embodiments of the present invention will be described with reference to the accompanying drawings.

Figure 1:
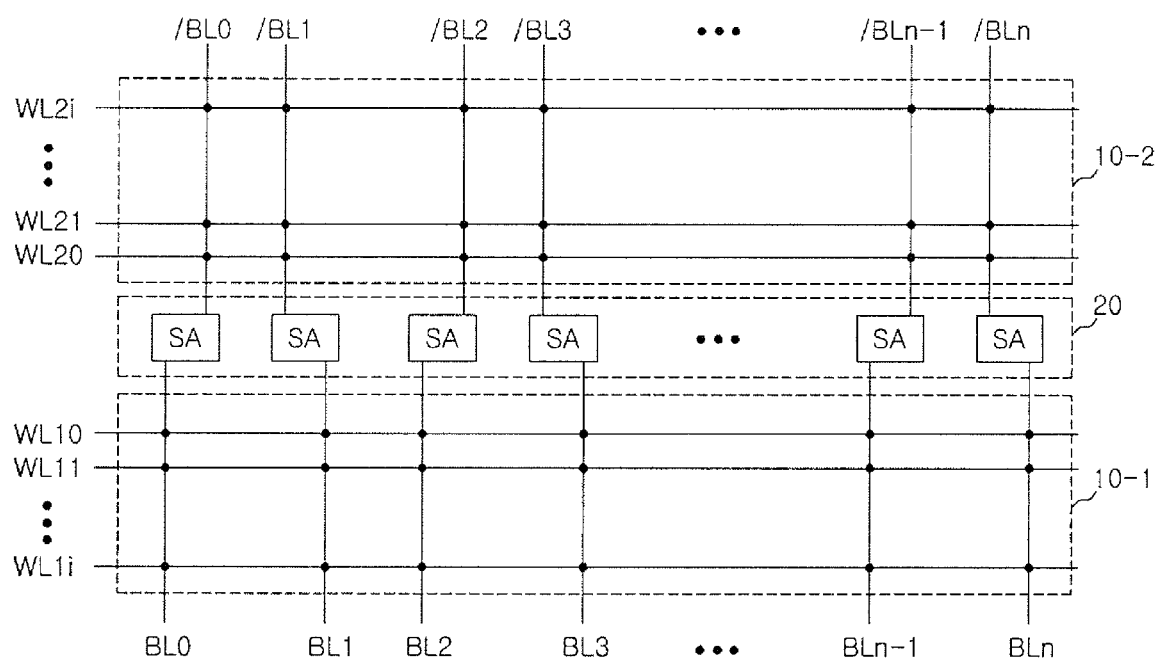
FIG. 1 is a view showing the configuration of a conventional semiconductor memory apparatus having an open bit line structure.
Figure 2:
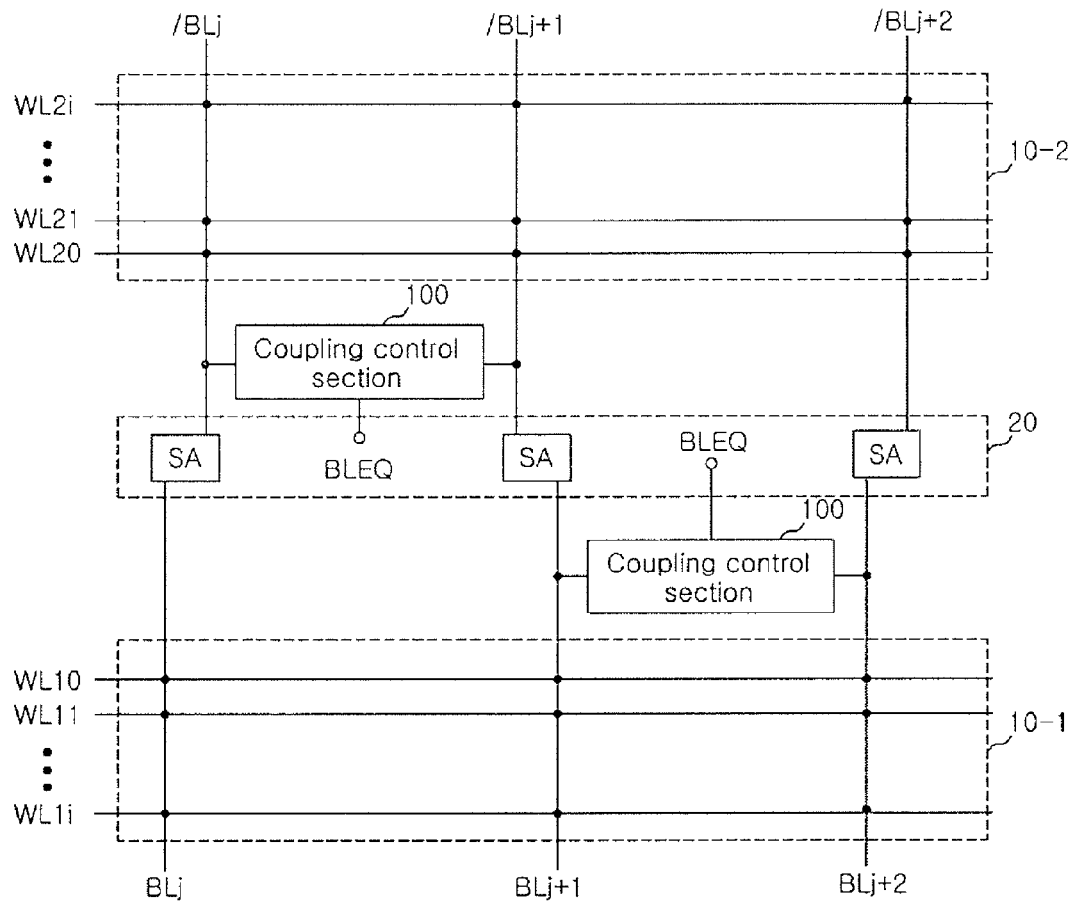
FIG. 2 is a schematic view showing the configuration of an exemplary semiconductor memory apparatus according to one embodiment of the present invention.

FIG. 2 is a schematic view showing the configuration of an exemplary semiconductor memory apparatus according to one embodiment of the present invention.

Referring to FIG. 2, a semiconductor memory apparatus according to one embodiment of the present invention has a dual open bit line structure. The semiconductor memory apparatus includes a plurality of cell mats 10-1 and 10-2 that have a plurality of memory cells (not shown) connected between word lines and bit lines, a sense amplifier block 20 located between the cell mats 10-1 and 10-2 and has a plurality of sense amplifiers connected to the bit lines for the memory cells of adjoining cell mats, and coupling control sections 100 that are connected between adjoining bit lines and between adjoining bit line bars and are driven by a bit line equalize signal 'BLEQ'.

In the current embodiment of the present invention, the coupling control sections 100 are connected between physically adjoining, i.e., adjacent, bit lines among the plurality of bit lines and between physically adjoining bit line bars among the plurality of bit line bars.

When the bit line equalize signal 'BLEQ' is at a high level, it sets the voltages of a sense amplifier power line signal 'RTO' and a sense amplifier ground line signal 'SB' to a preset voltage 'VBLP', such that the bit line and the bit line bar have the same voltage level. In addition, charge sharing begins between the bit line BL and the bit line bar /BL if the bit line equalize signal 'BLEQ' is at a low level for sensing operation.

That is to say, the bit line equalize signal 'BLEQ' is applied to precharge a sense amplifier or amplify the data applied to a bit line or a bit line bar. It is possible to prevent a coupling phenomenon from occurring between adjoining bit lines or adjoining bit line bars by driving the coupling control section 100 using the bit line equalize signal 'BLEQ'.

Figure 3:
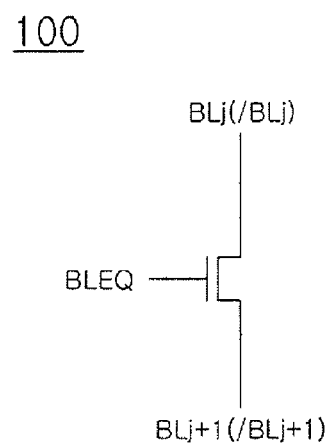
FIG. 3 is a schematic view showing an exemplary coupling control section capable of being implemented in the semiconductor memory apparatus of FIG. 2 according to one embodiment of the present invention.

FIG. 3 is a schematic view showing an exemplary coupling control section capable of being implemented in the semiconductor memory apparatus of FIG. 2 according to one embodiment of the present invention.

Referring to FIG. 3, the coupling control section 100 according to one embodiment of the present invention can be comprised of a switching element connected between adjoining bit lines BLj and BLj+1 or adjoining bit line bars /BLj and /BLj+1 and is driven by a bit line equalize signal 'BLEQ'.

When the bit line equalize signal 'BLEQ' is at a low level for sensing operation, the switching element can be turned off and can electrically insulate the adjoining bit lines or the adjoining bit line bars.

Accordingly, in the dual open bit line structure having bit lines and bit line bars arranged side by side, it is possible to prevent the semiconductor memory apparatus from malfunctioning due to a coupling phenomenon between adjoining bit lines or adjoining bit line bars when a certain bit line is activated and a sense amplifier is driven.

It is preferred that the coupling control section 100 comprise an NMOS transistor that is turned off when the bit line equalize signal 'BLEQ' is applied having a low level.

As shown, the coupling control section 100 can be formed between the adjoining bit lines BLj+1 and BLj+2 or the adjoining bit line bars /BLj and /BLj+1, which are physically close to each other as shown in FIG. 2. However, the present invention is not limited to this embodiment scheme only.

Figure 4:
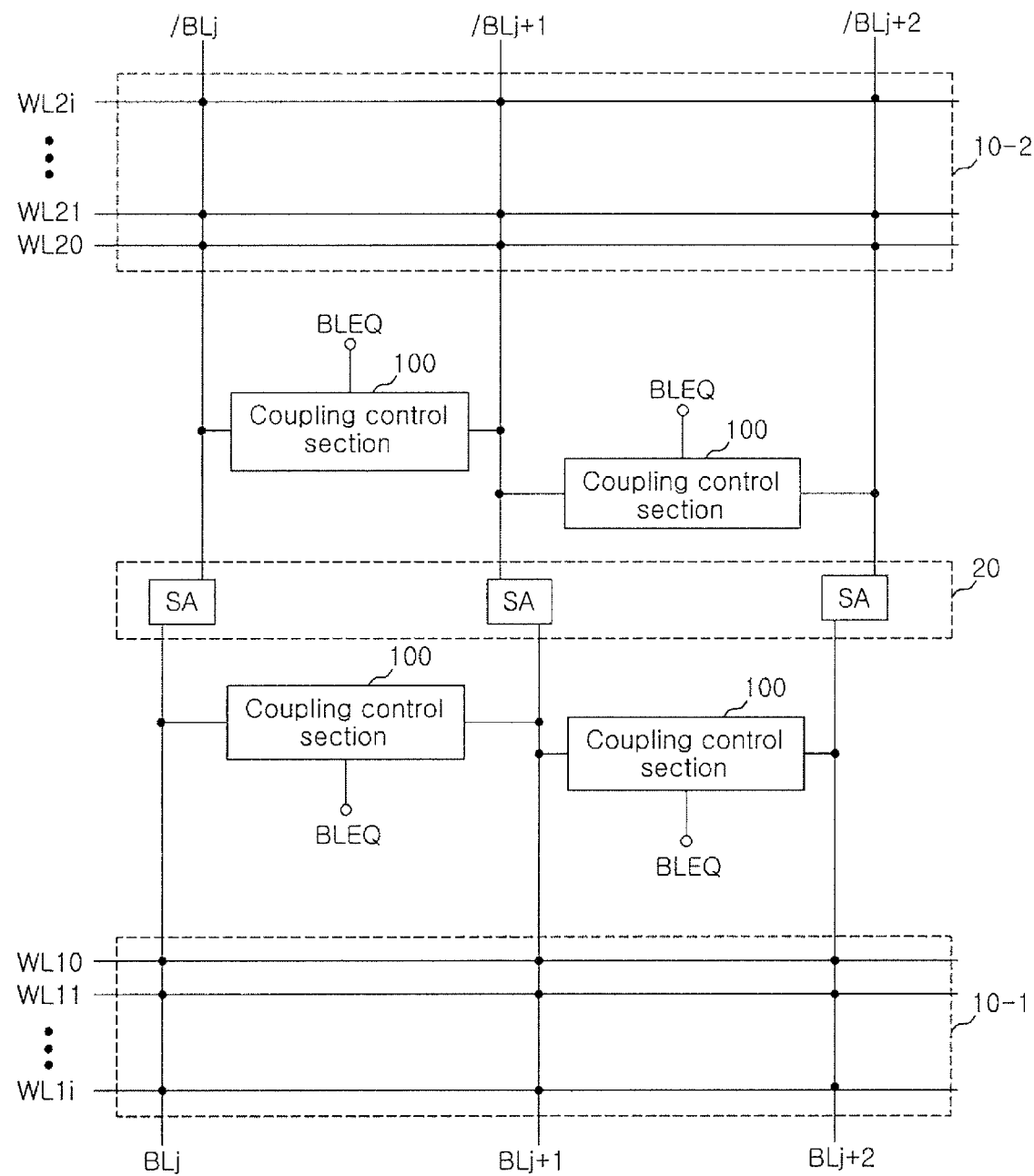
FIG. 4 is a schematic view showing the configuration of an exemplary semiconductor memory apparatus according to another embodiment of the present invention.

Namely, as shown in FIG. 4, coupling control sections 100 can be formed between all adjoining bit lines and between all adjoining bit line bars.

FIG. 4 is a schematic view showing a configuration of an exemplary semiconductor memory apparatus according to another embodiment of the present invention.

Referring to FIG. 4, coupling control sections 100 are connected between adjoining bit lines BLj and BLj+1 as well as between adjoining bit lines BLj+1 and BLj+2 and between adjoining bit line bars /BLj and /BLj+1 as well as between adjoining bit line bars /BLj+1 and /BLj+2.

In the case where the semiconductor memory apparatus Is configured as shown in FIG. 4, when the sense amplifiers operate, not only is the coupling phenomena between bit lines and between bit line bars that are physically close to each other prevented, but also the coupling phenomena between bit lines and between bit line bars that are distant from each other, i.e., farther apart from each other than the bit lines considered adjoining (i.e. adjacent) as is illustrated in FIG. 4.

Figure 5:
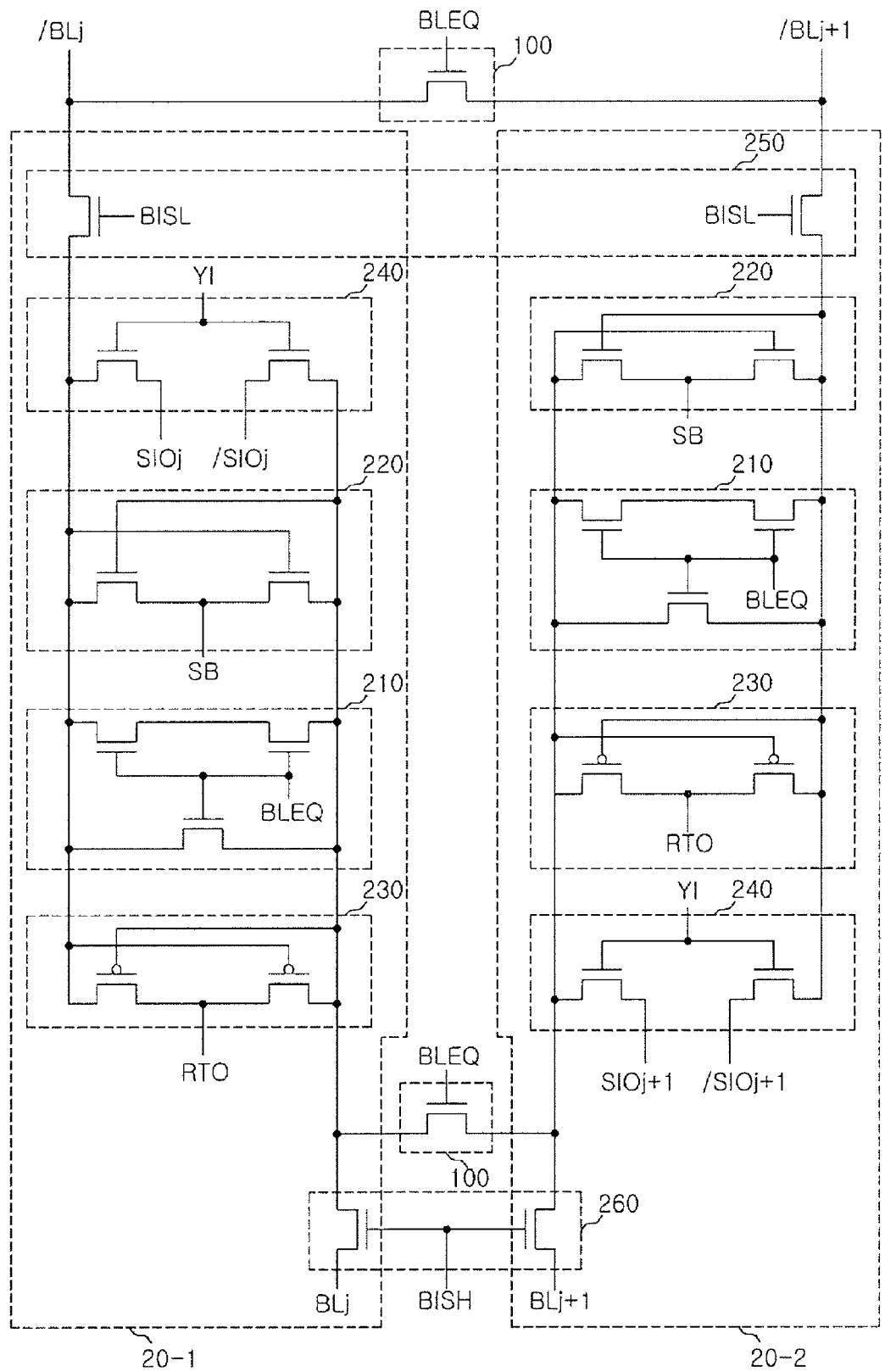
FIG. 5 is a schematic circuit diagram showing sense amplifiers capable of being implemented in the semiconductor memory apparatus of FIG. 4 according to another embodiment of the present invention.

FIG. 5 is a schematic circuit diagram of sense amplifiers capable of being implemented in the semiconductor memory apparatus of FIG. 4 according to another embodiment of the present invention. FIG. 5 shows a pair of adjoining sense amplifiers 20-1 and 20-2, and coupling control sections 100 that are connected to the sense amplifiers 20-1 and 20-2 via bit lines, i.e., BLj and BLj+1, and bit line bars, i.e., /BLj and /BLj+1.

The respective sense amplifiers 20-1 and 20-2 include precharge units 210 that apply the same voltage 'VBLP' to the bit lines and bit line bars in response to a bit line equalize signal 'BLEQ', first amplification units 220 that amplify the voltage applied to the bit lines and the bit line bars in response to a sense amplifier ground line signal 'SB', and second amplification units 230 that amplify the potential applied to the bit lines and the bit line bars in response to a sense amplifier power line signal 'RTO' The respective sense amplifiers 20-1 and 20-2 also include output units 240 that output the amplified data of the bit lines and the bit line bars to input and output lines SIOj, /SIOj and SIOj+1, /SIOj+1 in response to a column select signal 'YI' when a difference in voltage between the bit lines and the bit line bars is greater than a preset level due to the amplification by the first and second amplification units 220 and 230. Finally, the respective sense amplifiers 20-1 and 20-2 include first insulation units 250 that insulate adjoining memory cells and the sense amplifiers in response to a first bit line isolation signal 'BISL' and second insulation units 260 that insulate the physically adjoining memory cells and the sense amplifiers in response to a second bit line isolation signal 'BISH'.

In the dual open bit line structure, the first and second insulation units 250 and 260 can be omitted since the isolation of the sense amplifiers and the adjoining memory cells is not necessary.

The coupling control sections 100 are connected between the adjoining bit lines BLj and BLj+1 and between the adjoining bit line bars /BLj and /BLj+1. The coupling control sections 100 are driven by a bit line equalize signal 'BLEQ'.

For example, when the sense amplifier 20-1 operates, the switching element of the coupling control section 100 can be turned on. Accordingly, the adjoining bit lines BLj and BLj+1 or the adjoining bit line bars /BLj and /BLj+1 can be electrically insulated, thereby making it possible to prevent a coupling phenomenon from occurring between the bit lines or bit line bars.

According to the detailed embodiments of the present invention, in a semiconductor memory apparatus having a dual open bit line structure in which bit lines or bit line bars are arranged side by side, it is possible to prevent a coupling phenomenon from occurring between adjoining bit lines or bit line bars.

Accordingly, the overall operational reliability of the semiconductor memory apparatus can be improved.

As a result, according to the embodiments of the present invention, the coupling phenomenon between adjoining bit lines can be prevented and the operational reliability of the semiconductor memory apparatus can be improved.

Although an exemplary embodiment has been described for illustrative purposes, those skilled in the art will appreciate that various modifications, additions and substitutions are possible, without departing from the scope and the spirit as disclosed in the accompanying claims.

What is claimed is:

1. A semiconductor memory apparatus having a dual open bit line structure in which bit lines or bit line bars are each arranged side by side in adjoining cell mats, the apparatus comprising:
   a coupling control section connected between all adjoining bit lines or all adjoining bit line bars and driven by a bit line equalize signal,
   wherein the coupling control section is configured to electrically insulate all adjoining bit lines or all adjoining bit line bars during a sensing operation.

2. The semiconductor memory apparatus according to claim 1, wherein the coupling control section comprises a switching element.

3. The semiconductor memory apparatus according to claim 1, wherein the coupling control section comprises a switching element.

4. A semiconductor memory apparatus having a dual open bit line structure in which bit lines or bit line bars are each arranged side by side in adjoining cell mats, the apparatus comprising:
- a plurality of cell mats having a plurality of memory cells formed therein that are connected between word lines and the bit lines;
- a sense amplifier block located between the plurality of cell mats and having a plurality of sense amplifiers located therein to which the bit lines for memory cells of adjoining cell mats are connected; and
- a coupling control section connected between all adjoining bit lines or all adjoining bit line bars and driven by a bit line equalize signal,
- wherein the coupling control section is configured to electrically insulate all adjoining bit lines or all adjoining bit line bars during a sensing operation.

* * * * *